United States Patent
Smith

(10) Patent No.: US 10,519,033 B2
(45) Date of Patent: Dec. 31, 2019

(54) TRANSDUCER APPARATUS AND METHODS

(71) Applicant: Cirrus Logic International Semiconductor Ltd., Edinburgh (GB)

(72) Inventor: Ian Johnson Smith, Rosewell (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/935,612

(22) Filed: Mar. 26, 2018

(65) Prior Publication Data
US 2018/0282149 A1 Oct. 4, 2018

Related U.S. Application Data

(60) Provisional application No. 62/479,662, filed on Mar. 31, 2017.

(30) Foreign Application Priority Data

Apr. 27, 2017 (GB) .................................. 1706714.1

(51) Int. Cl.
| | | |
|---|---|---|
| H04R 3/00 | (2006.01) | |
| B81B 7/00 | (2006.01) | |
| H04R 19/00 | (2006.01) | |
| H04R 19/04 | (2006.01) | |
| G01H 11/06 | (2006.01) | |

(52) U.S. Cl.
CPC ............ B81B 7/008 (2013.01); H04R 19/005 (2013.01); H04R 19/04 (2013.01); *B81B 2207/015* (2013.01); *B81B 2207/03* (2013.01); *B81B 2207/096* (2013.01); *G01H 11/06* (2013.01); *H04R 2201/003* (2013.01); *H04R 2499/11* (2013.01)

(58) Field of Classification Search
CPC ............... B81B 7/008; B81B 2201/02; B81B 2201/0221; B81B 2201/0228;
(Continued)

(56) References Cited

U.S. PATENT DOCUMENTS

| | | | | |
|---|---|---|---|---|
| 9,040,360 B1 * | 5/2015 | Minervini | ............ | H04R 19/016 257/704 |
| 2008/0075306 A1 * | 3/2008 | Poulsen | ............... | H04R 19/005 381/111 |

(Continued)

FOREIGN PATENT DOCUMENTS

| | | | | |
|---|---|---|---|---|
| WO | 2016016648 A1 | 2/2016 | | |
| WO | WO-2016016648 A1 * | 2/2016 | ......... | B81C 1/00246 |

OTHER PUBLICATIONS

Combined Search and Examination Report under Sections 17 and 18(3), UKIPO, Application No. GB1706714.1, dated Oct. 27, 2017.
(Continued)

*Primary Examiner* — Leshui Zhang
(74) *Attorney, Agent, or Firm* — Jackson Walker L.L.P.

(57) ABSTRACT

This application relates to transducer apparatus (300, 400), especially for MEMS capacitive transducers. The apparatus has a voltage bias generator (102) for receiving a supply voltage ($V_{DD}$) and generating a bias voltage ($V_B$) for biasing a capacitive transducer (101). A voltage supply path extends between a supply voltage input terminal (309a) and the voltage bias generator (102). A programmable trim circuit (207), in use, controls the bias voltage generated by the voltage bias generator. A first filter (301) is configured to applying filtering to the voltage supply path. A programming contact pad (308) is configured to form an external contact of the transducer apparatus when packaged and is electrically coupled to the programmable trim circuit via a signal path that does not include the first filter.

18 Claims, 3 Drawing Sheets

(58) Field of Classification Search
CPC ...... B81B 2201/025; B81B 2201/0257; B81B 2201/0285; B81B 2207/00; B81B 2207/01; B81B 2207/012; B81B 2207/015; B81B 2207/017; B81B 2207/11; B81B 2207/03; B81B 2207/096; B06B 1/0292; B81C 2203/00; B81C 2203/01; B81C 2203/0109; G01H 11/06; G01H 11/08; H04R 3/00; H04R 3/007; H04R 3/005; H04R 3/06; H04R 3/10; H04R 19/00; H04R 19/005; H04R 19/01; H04R 19/016; H04R 19/04; H04R 2201/003; H04R 2499/00; H04R 2499/10; H04R 2499/11
USPC ... 381/323, 111, 113, 112, 114, 122, 92, 91, 381/74, 72
See application file for complete search history.

(56) References Cited

U.S. PATENT DOCUMENTS

| | | |
|---|---|---|
| 2009/0180644 A1 | 7/2009 | Jiang |
| 2010/0277229 A1 | 11/2010 | Lee et al. |
| 2012/0148083 A1* | 6/2012 | Knauss ................. H04R 19/04 381/361 |
| 2014/0264652 A1 | 9/2014 | Cagdaser et al. |

OTHER PUBLICATIONS

International Search Report and Written Opinion of the International Searching Authority, International Application No. PCT/GB2018/050753, dated Jun. 21, 2018.

* cited by examiner

TRANSDUCER APPARATUS AND METHODS

This invention relates to methods and apparatus for operating transducers, in particular capacitive transducers such as microphones and especially to MEMS transducers.

BACKGROUND

Consumer electronics devices are continually getting smaller and, with advances in technology, are gaining ever-increasing performance and functionality. This is clearly evident in the technology used in consumer electronic products and especially, but not exclusively, portable products such as mobile phones, audio players, video players, personal digital assistants (PDAs), various wearable devices, mobile computing platforms such as laptop computers or tablets and/or games devices. Requirements of the mobile phone industry for example, are driving the components to become smaller with higher functionality, lower power consumption and reduced cost.

Micro-electromechanical-system (MEMS) transducers are finding application in many of these devices. These may be, for example, capacitive transducers for detecting and/or generating pressure/sound waves or transducers for detecting acceleration. MEMS capacitive microphones typically comprise a first electrode, which is moveable with respect to a second fixed electrode in response to incident acoustic waves. The first electrode may, for example, be supported by a flexible membrane. By measuring changes in the capacitance between the electrodes the incident acoustic signals can be detected. In use the electrodes of the MEMS microphone may be biased by biasing circuitry and the measurement signal may be amplified by amplifier circuitry such as a low-noise amplifier.

FIG. 1 shows an example of a typical arrangement of a capacitive transducer apparatus 100. In use a biasing voltage $V_B$ is applied to one plate or electrode of the capacitive sensor 101, e.g. a MEMS microphone. The bias voltage is typically generated by a voltage bias generator, which may typically comprise a voltage regulator or DC-DC converter such a charge pump 102 which receives a supply voltage $V_{DD}$ and generates the bias voltage $V_B$. The bias voltage may be applied to the capacitive transducer 101 via a bias filter comprising bias impedance 103 and bias filter capacitance 104. The bias impedance 103 is arranged in the biasing path between the charge pump 102 and capacitive transducer 101 and the bias filter capacitor is connected between a node of this bias path and a controlled voltage, which in this example is ground.

Another electrode of capacitive transducer 101 is connected to a defined voltage, in this example, also ground, via a high impedance 105. This provides a signal voltage $V_{IN}$ resulting from deflections of one electrode of the capacitive transducer 101 with respect to the other. This signal voltage $V_{IN}$ is amplified by an amplifier arrangement 106 to provide an output signal $S_{OUT}$.

Typically the biasing and readout circuitry are integrated together as part of an integrated circuit on a semiconductor die 107, i.e. as part of the same chip, which thus has at least die contacts 108a-c, e.g. die circuit pads or pins, for receiving $V_{DD}$, connecting to ground and outputting the output signal $S_{OUT}$ respectively. The die 107 is typically mounted on an apparatus substrate, such as a PCB (printed circuit board) substrate (not shown in FIG. 1) with connections made between the die 107 and the PCB substrate and then the die 107 and PCB substrate are packaged in some suitable package. The package will have various external contacts, e.g. pads or pins, that are electrically connected to the circuitry within the package to allow for suitable electrical connections to be made to the package, e.g. for supply voltage, ground and an input/output signal. In a host device the packaged microphone may be mounted on some circuit board or other device substrate.

In some implementations the capacitive transducer 101 may be co-integrated with the biasing and readout circuit as part of the same die or chip 107, but in other instances the capacitive transducer may be formed on a separate die 107a which is packaged with die 107 and appropriate circuit connections made between the two dies.

There is a continual drive to reduce the size and cost of such MEMS microphones and to minimize the area and space taken up with such transducers, for example to enable the use of MEMS transducers that are suitable for embedding in earbuds for noise cancellation or other requirements for acousto-electrical feedback such as speaker linearization.

Increasingly however there is also a desire for improved performance and consistency from such transducers. Two issues that may impact performance are part-to-part manufacturing variations, that may result in different examples of the same transducer product exhibiting different sensitivity to a given input stimulus, and electromagnetic interference, that may result in unwanted noise.

SUMMARY

Embodiments of the present disclosure relate to methods, apparatus and circuitry for use with transducers, especially MEMS capacitive transducers that at least mitigate at least some of these issues.

Embodiments of the present invention therefore provide a transducer apparatus comprising:
- a voltage bias generator for receiving a supply voltage and generating a bias voltage for biasing a capacitive transducer;
- a voltage supply path between a supply voltage input terminal and the voltage bias generator;
- a programmable trim circuit for, in use, controlling the bias voltage generated by the voltage bias generator;
- a first filter configured to applying filtering to the voltage supply path; and
- a programming contact pad that is electrically coupled to the programmable trim circuit via a signal path that does not include the first filter, the programming contact pad being configured to form an external contact of the transducer apparatus when packaged.

The programming contact pad may be electrically connected to the voltage supply path at a node between the first filter and the voltage bias generator. The programmable trim circuit is also electrically connected to the voltage supply path between the first filter and the voltage bias generator.

The first filter may comprise a first filter resistor in series in the voltage supply path. The programming contact pad may be electrically connected to the voltage supply path at a node between the first filter resistor and the voltage bias generator.

The programmable trim circuit may be arranged so as not to be electrically coupled to the voltage supply input terminal other than via the first filter.

The voltage bias generator and the programmable trim circuit may be formed as an integrated circuit on a semiconductor die. The semiconductor die may be coupled to an apparatus substrate. The supply voltage input terminal may be a contact of the apparatus substrate. The voltage supply path may comprise a supply die contact of the semiconductor die.

The first filter may be formed on the apparatus substrate. The programming contact pad may be formed on the apparatus substrate on an opposite side of the apparatus substrate to the semiconductor die.

The transducer apparatus may further comprise a ground contact pad electrically coupled to a ground path for the programmable trim circuit. The ground contact pad may also formed on the apparatus substrate.

The transducer apparatus may further comprise an amplifier arrangement for amplifying an input signal from the capacitive transducer. A signal output path may extend between the amplifier arrangement and a signal out terminal. The apparatus may comprise a second filter for applying filtering to the signal out path. The second filter may be formed on the apparatus substrate.

The apparatus substrate may comprises a printed circuit board.

The transducer apparatus may further comprise capacitive transducer. The capacitive transducer may be a MEMS capacitive transducer and/or may be a microphone.

The transducer apparatus may be packaged within a shielded housing having a plurality of external package contacts electrically connected to the transducer apparatus within the housing. The programming contact pad may be one of said external package contacts. The apparatus substrate may form part of the package housing.

When the transducer apparatus is located in a host device the programming contact pad may be not connected to any conductive path outside of the housing.

Aspects also relate to an electronic device comprising a transducer apparatus as described in any of the variants above. The device may be at least one of: a communications device; a mobile or cellular telephone; a computing device; a laptop, notebook, or tablet computer; a gaming device; a personal media device; a portable device; a battery powered device; a wearable device.

In a further aspect there is a transducer apparatus comprising:
  a package structure;
  an integrated circuit die within the package structure;
wherein the integrated circuit die comprises: a voltage bias generator for receiving a supply voltage and generating a bias voltage for biasing a capacitive transducer; and a programmable trim circuit for, in use, controlling the bias voltage generated by the voltage bias generator and wherein the voltage bias generator and programmable trim circuit are both electrically connected to a first die contact on said die;
  a first filter formed within the package structure on a first substrate, the first filter comprising a filter resistor in series in a voltage supply path between a voltage supply terminal of the first substrate and the first die contact; and
  a programming contact pad forming an external electrical contact of the packaged structure, the programming contact pad being electrically coupled to a node of the voltage supply path between the filter resistor and the first die contact.

The first substrate may form part of the package structure. The programming contact pad may be formed on an opposite side of the first substrate to the first filter. The integrated circuit die may be coupled to the first substrate.

Aspects also relate to transducer circuitry comprising:
  an integrated circuit on a circuit board; the integrated circuit comprising a bias generator and a programmable circuit block coupled to a first die contact;
  a voltage supply path on the circuit board for, in use, supplying a voltage to the first die contact via a first filter; and
  a contact pad formed on an opposite side of the circuit board to the first filter and electrically coupled to the voltage supply path at a node downstream of the first filter.

A further aspects provides a transducer apparatus comprising:
  a voltage bias generator for receiving a supply voltage and generating a bias voltage for biasing a capacitive transducer;
  a voltage supply path between a supply voltage input terminal and the voltage bias generator;
  a programmable trim circuit for, in use, controlling the bias voltage generated by the voltage bias generator;
  a first filter configured to applying filtering to the voltage supply path; and
  a programming contact pad that is electrically coupled to the programmable trim circuit via a signal path that does not include the first filter;
  wherein the programmable trim circuit is not electrically coupled to the voltage supply input terminal other than via the first filter.

BRIEF DESCRIPTION OF THE FIGURES

To explain various aspects of the present disclosure various embodiments will now be described, by way of example only, with reference to the accompanying drawings, of which.

DESCRIPTION

As mentioned above, capacitive transducers such as MEMS transducers, e.g. MEMS microphones are increasingly being used in portable devices with communication capability, e.g. mobile telephones or the like. Such devices will include at least one antenna for transmitting RF signals. The amount of power transmitted by such devices can be relatively high and is set to increase with changes to the communication standards. This can cause a problem is the transmitted RF signals couple to the biasing and/or readout circuitry. The readout circuitry is typically CMOS circuitry and is inherently non-linear. If RF signals couple to such circuitry, such signals may be demodulated to the signal band. This may therefore result in unwanted signal noise, which for a microphone may be audible noise such as the so-called "bumblebee noise". This problem may be exacerbated when using MEMS microphones with integrated CMOS circuitry as in many devices the position of the antenna happens to be close to the position where the microphone is required.

The MEMS microphone package may be shielded, for instance surrounded by grounded conductive material for EMI shielding but coupling of RF noise into MEMS transducer circuitry via the signal paths for external communication, i.e. via suitable signal paths between package contacts and the die contacts 108*a-c*, remains a problem.

To mitigate the effects of EMI coupling to the circuitry, e.g. amplifier 106, it has been proposed to arrange filters on the signal lines for input/output of signals to from the die 107.

Figure 1:
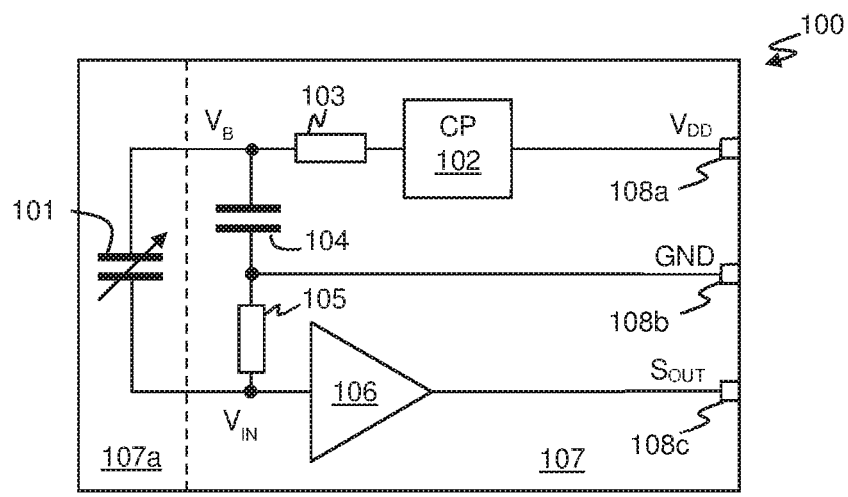
FIG. 1 illustrates one example of a capacitive transducer apparatus.
Figure 2:
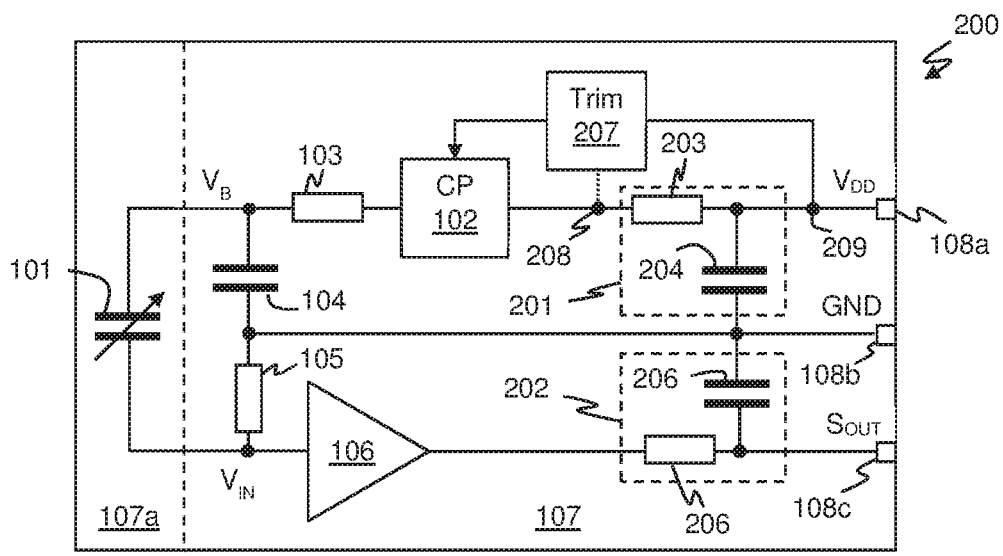
FIG. 2 illustrates a capacitive transducer apparatus with one example of signal path filters and a bias trimming circuit.

FIG. 2 shows one example of a capacitive transducer apparatus 200 having filters for reducing EMI where similar components to those discussed previously are identified using the same reference numerals. FIG. 2 illustrates a first filter 201 arranged to applying filtering to the voltage supply path for supplying $V_{DD}$ to the voltage bias generator, i.e. charge pump 102. In this example a second filter 202 is arranged to applying filtering to the output signal path for outputting the output signal $S_{OUT}$. The first filter 201 in this example is an RC filter with resistance 203 arranged in series in the voltage supply path and capacitance 204 coupled between the $V_{DD}$ voltage supply path and ground. The second filter 202 likewise comprises resistance 205 and capacitance 206. In this example the filters 201 and 202 are co-integrated with the biasing and amplifier circuity on die 107. Thus the first filter 201 is located in a path between the die contact 108*a* for receiving the supply voltage $V_{DD}$ and the charge pump 102 and the second filter 202 is located in a signal path between the amplifier 106 and die contact 108*c* for outputting the output signal $S_{OUT}$.

The filters 201 and 202 may be arranged to filter any high frequency signals such as may be associated with RF transmissions whilst having no substantial effect on the signal band of interest, e.g. the audio signal band for microphones. This prevents the RF noise from coupling to the CMOS circuitry, e.g. of charge pump 102 and/or amplifier 106 and demodulating into the signal band of interest.

In general it is desirable for MEMS transducers to have consistent part-to-part performance, i.e. that one example of a particular MEMS microphone product performs substantially the same, in terms of sensitivity, to another example of the same MEMS microphone product. This is especially the case where multiple microphones are used in the same device.

In practice manufacturing processes may typically result in some part-to-part variation between different examples of the same product, which can result in a different sensitivity, i.e. for a microphone the level of output signal $S_{OUT}$ for a given sound pressure level (SPL) applied to the microphone. To address this issue the system 200 may comprise a programmable trim circuit 207 for adjusting the operation of the bias voltage generator 102 so as to vary the bias voltage $V_B$ applied to the transducer in use. The sensitivity of the transducer to a given stimulus is related to the bias voltage $V_B$ applied and thus by adjusting the bias voltage the performance of the system 200 can be calibrated to a desired performance standard. The programmable trim circuit 207 may control the operation of the charge pump 102 and/or control a voltage supplied to the charge pump 102, so as to produce a desired bias voltage $V_B$. Typically the programmable trim circuit 207 is configured so as to be programmed in a factory calibration process during manufacture so that, in use, the transducer system 200 exhibits a desired sensitivity. There are various ways that the programmable trim circuit 207 may control the operation of a bias voltage generator such charge pump 102 to provide a desired output voltage as would be understood by one skilled in the art.

Typically the programmable trim circuit 207 comprises a one-time programmable (OTP) memory arrangement for storing the desired calibration settings, e.g. a programmable fuse array of fuses that can be blown in a desired configuration.

As will be understood by one skilled in the art such a programmable element is typically programmed by applying a sequence of relatively high current pulses to blow the fuses with the sequence of pulses being controlled in a sequence to blow the appropriate fuses.

To provide the correct part-to-part performance the relevant measurements for calibrating the microphone sensitivity are typically performed on the packaged microphone device. Thus the processing steps up to and including packaging of the system 200 are performed before the package microphone 200 is subjected to testing to determine an appropriate trim setting to the be applied to the programmable trim circuit 207. The programmable trim circuit 207 is thus programmed once the device has been packaged and the relevant control signals to the programmable trim circuit are thus supplied to the package. Typically the programmable trim circuit 207 is programmed via supplying suitable control signals an external contact of the package that connects to the voltage supply path.

An issue arises however with the programming of trim circuit 207 when the relevant signal line for supplying the control signals to the programmable trim circuit comprises a filter for filtering out unwanted RF interference. FIG. 2 shows that the programmable trim circuit is connected to voltage supply path so that the programming pulses can be applied to the circuit via the $V_{DD}$ supply die contact 108*a*— this avoids the need for a separate die contact, i.e. pad/pin on die 107 for applying the programming pulses which would add to the required chip area.

FIG. 2 illustrates that the input to the programmable trim circuit 207 could be tapped from a node 208 of the voltage supply path which is downstream (in the sense of supplying voltage from die contact 108*a* to the charge pump 102) of the first filter 201. If this were the case the trim circuit 207 would receive a filtered version of the voltage applied to die contact 108*a*. The effect of the first filter 201 is to attenuate high frequency signals and thus the trim circuit 207 would receive a filtered version of the programming pulses. This may mean that there is insufficient current to correctly blow the required fuses and the presence of the first filter interferes with the programming of the trim circuit 207.

As an alternative the programmable trim circuit 207 may be coupled, as illustrated in the FIG. 2, to a node 209 of the $V_{DD}$ supply path upstream of the first filter 201. There may be no or relatively limited filtering applied in the signal path between node 209 and the trim circuit 207. This means that the programmable trim circuit 207 can satisfactorily programmed via die contact 108*a*, e.g. pin/pad 108*a*. However this does mean that there is a substantially unfiltered signal path between an input to the circuit and at least some circuitry, i.e. between die contact 108*a* and the programmable trim circuit 207. Given that, in the packaged device, the die contact 108*a* will be connected to an external package contact, i.e. a supply contact, which will be connected to other supply/signal paths of the host device, this still provides a path for unwanted RF signals to couple to CMOS circuitry and demodulate into the signal band and appear as unwanted noise on the output signal $S_{OUT}$.

Figure 3:
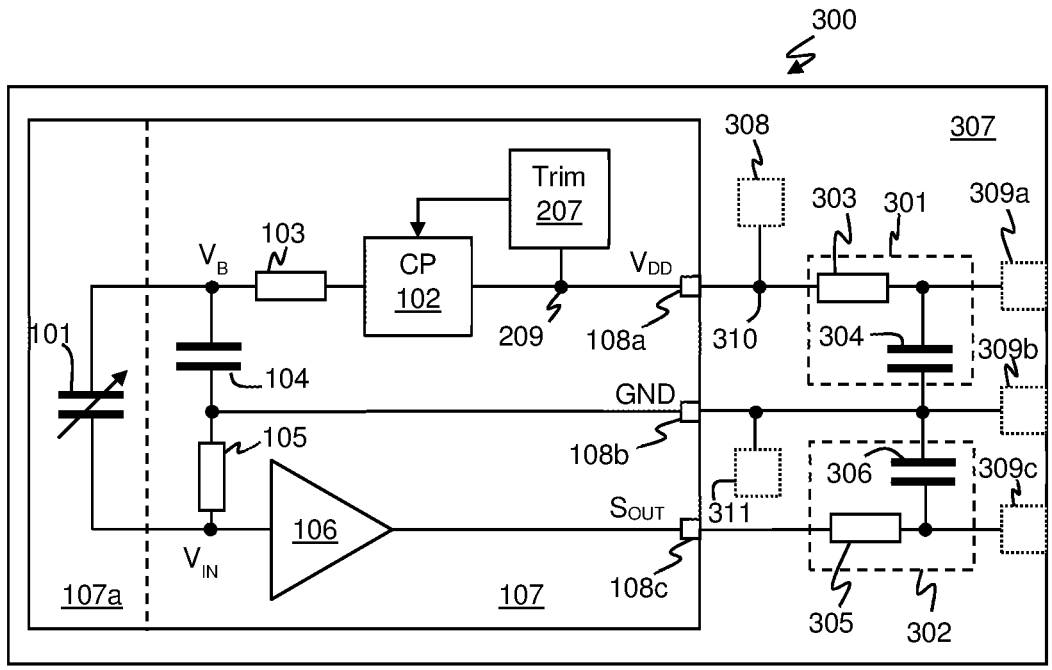
FIG. 3 illustrates a capacitive transducer apparatus according to an embodiment.

FIG. 3 illustrates a transducer apparatus 300 according to an embodiment of the disclosure where similar component are identified by the same reference numerals as used previously.

The transducer apparatus 300 illustrated in FIG. 3 has a first filter 301 for applying filtering to the voltage supply path for supplying $V_{DD}$. In this example there is also a second filter 302 coupled to the signal out die contact 108c. In this example the first filter 301 comprises a passive RC filter with series resistance 303 in the supply path and capacitance 304 coupled between the voltage supply path and a defined voltage, in this example ground. Likewise the second filter 302 has series resistance 305 and capacitance 306. However other filter arrangements could be implemented. The first and second filters 301 and 302 may be arranged to provide filtering for unwanted RF noise coupling to the biasing and amplifier circuitry as described above. The transducer system 300 also has a programmable trim circuit 207 for controlling the output of the bias voltage generator, i.e. the charge pump 102 to a desired bias voltage to provide a desired sensitivity.

In the embodiment of FIG. 3 the first and second filters are not formed as part of the integrated circuit die 107. In the embodiment of FIG. 3 the first and second filters 301 and 302 are formed on an apparatus substrate 307. In the example of FIG. 3 the apparatus substrate 307 is a substrate on which the die 107 is mounted. As described above the circuit die 107 would typically be mounted on a PCB substrate and electrical connections made between the PCB substrate 307 and die 107 before being packaged. The PCB substrate 307 comprises at least PCB terminals 309a-c for making an external electrical connections through the package to provide suitable external package contacts for the supply voltage $V_{DD}$, ground (or other reference voltage) and for outputting the output signal $S_{OUT}$ respectively.

In embodiments of the present disclosure a programming contact pad 308 is provided that, in the packaged device, provides an external contact for the package. The programming contact pad 308 is electrically coupled to the trim circuit via a signal path that does not include the first filter 301, or the second filer 302. In the embodiment of FIG. 3 the programming contact pad 308 connects to a node 310 of $V_{DD}$ supply path. In this example the programming contact pad 308 is formed on the apparatus substrate 307, on the opposite side of the substrate to the circuitry of the first and second filters 301 and 302 and the die 107. The programming contact pad 308 may for instance be electrically connected to the $V_{DD}$ voltage supply path by way of a through-via as illustrated in FIG. 4.

Figure 4:
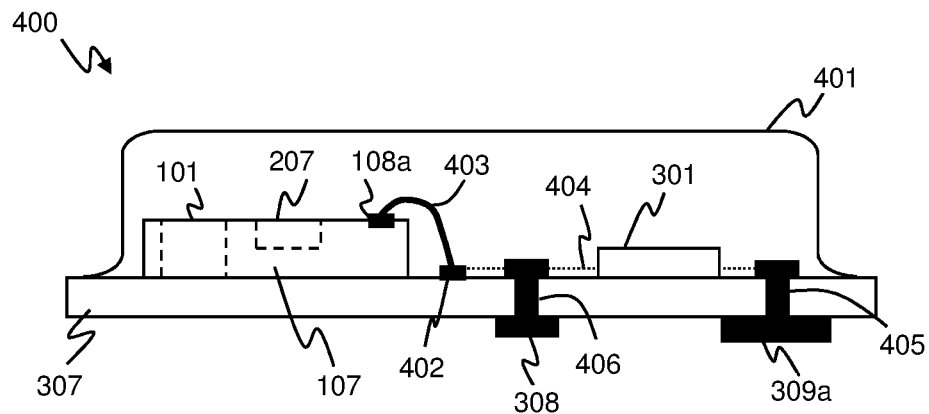
FIG. 4 illustrates a packaged capacitive transducer device according to an embodiment.

FIG. 4 illustrates schematically the principles of the packaged transducer device 400 according to an embodiment. FIG. 4 illustrates that die 107 is mounted on PCB substrate 307. In this example a housing 401 is mounted on the PCB substrate 307 to form the package. The housing may comprise a metallic material to provide shielding for the internal components, and the PCB substrate 307 may also have a ground shield. For a microphone a sound port (not shown) may be formed in the housing 401 or PCB substrate 307. It will be appreciated however that many other packaging arrangements are known and may be implemented. FIG. 4 illustrates that the die 101 comprises the MEMS transducer 101 and circuitry including the programmable trim circuit 207. The programmable trim circuit 207 is coupled to the die contact 108a by suitable circuit pathways (not shown). The die contact 108a is coupled to a suitable contact 402 on the PCB substrate 307. FIG. 4 illustrates a connection via a bond wire 403 to bond pad 402 to illustrate one example of a connection, although other connections, such as through-silicon-vias in the die 107, may be used in some implementations. Conductive pathways (illustrated generically by dotted line 404) of the PCB substrate 307 connect the bond pad 402 to a PCB terminal 309a, i.e. the supply voltage input terminal, via filter 301. In this example the external package supply terminal 309a is connected to the internal circuitry by a substrate through-via structure 405 as will be understood by one skilled in the art, and thus the electrically conductive pathways 404 within the package couple to an internal terminal of the through-via structure 405. The bond pad 402 is also electrically connected to the programming contact pad 308 in a signal path that does not include the first filter 301. In this example the external programming contact pad 308 is also connected to the internal circuitry by a substrate through-via structure 406, and thus the electrically conductive pathways 404 within the package could to an internal terminal of the through-via structure 406.

The programming contact pad 308 is arranged such that it can be readily and reliable used to make an electrical connection to some external apparatus during a processing step after packaging of the transducer apparatus. For instance the programming contact pad 308 may be dimensioned and positioned so that it can be readily contacted via a probe, for instance a contact probe of some ATE (automated test equipment) apparatus, so as to provide a reliable electrical connection. This provides a route to supply suitable control signals to the trim circuit 207 for programming the programmable trim circuit 207, i.e. suitable high voltage pulses, via the probe and the programming contact pad 308. The signal path between the programming contact pad 308 and programmable trim circuit avoids the first or second filters 301 and 302 and may have no, or only relatively light, filtering applied, to an extent that is unlikely to interfere with programming of the trim circuit 207. Once the trim circuit 207 has been programmed the test probe can be removed and the system can be used in a host device.

The programming contact pad can be relatively small. The exact size of the programming contact pad 308 may depend on the particular external apparatus, e.g. ATE apparatus, intended to be used for programming the trim circuit as would be understood by one skilled in the art. In the embodiment of FIG. 3 the programming contact pad 308 is thus provided on the opposite side of an apparatus substrate 307, in this example a PCB substrate, on which die 107 is mounted. It will be appreciated however that this is just one arrangement. An apparatus on which die 107 is mounted may itself be mounted on one or more further layers in a finished package with appropriate electrical connections through the layers if needed. The apparatus substrate may thus be a single layer or multi-layer structure. In some examples the die 107 could be located on a first substrate with at least some external package contacts being formed on the exterior of a different layer, i.e. a second substrate. For instance the die could be located on the interior of a package base and at least some external contacts for the package could be located on a lid or sidewall of the package (or vice versa), in which case there may be suitable vias through the relevant part of the package between the external contact and an internal terminal and appropriate electrical connections made within the package. In some instances at least part of the circuitry of the first and/or second filters 301 and 302 may be formed on an interior surface of the package different to the surface on which the die 107 is mounted. In general however in embodiments an external package supply contact, e.g. 309a, may connected in an electrical voltage supply path to die 107 that includes the first filter 301 and the programming contact pad provides an electrical path from outside the package to die 107 via part of the voltage supply path and which avoids or bypasses the first filter 301.

In the embodiment of FIGS. 3 and 4 the signal path between the programming contact pad 308 and the trim circuit 207 passes via the $V_{DD}$ die contact 108a of die 107. This avoids the need for a dedicated pin/pad on the die 107 for programming the programmable trim circuit 207 and thus helps minimize pin count for this die as discussed above.

The programming contact pad 308 is coupled to a node 310 of the voltage supply path between the first filter 301 and the voltage bias generator, i.e. charge 102. In this embodiment node 310 is on the PCB substrate 307 and is a node of the voltage supply path located between the first filter 301 and the connection to die supply contact 108a. In particular the programming contact pad 308 is coupled to the node 310 which is located between the resistor 303 of the first filter 301 and the connection to die contact 108a. The programmable trim circuit 207 is also connected to the voltage supply path, but on die 107 and thus again downstream of the first filter 301. Thus programming contact pad 308 provides a route for supplying voltages to the programmable trim circuit 207 that bypass the filter resistance 303.

In the packaged device the supply voltage terminal, i.e. PCB external contact 309a, will be electrically coupled to circuitry of a host device to receive the supply voltage. The external supply path may provide a route for RF noise to couple into the packaged microphone device. However any RF noise that couples to the supply path will be filtered, within the package, by the first filter 301. In use, the programming contact pad 308 of the package will be left unconnected to any circuitry. In theory any RF signals coupling to this contact pad may couple into the package. However the programming contact pad 308 itself will be relatively small and, as mention will be left disconnected from any external path of element that may act as an antenna. It will likely be shielded by the PCB ground and thus will not have any substantial impact on normal device operation. Thus in the calibration and programming step performed for the packaged device 400, the programming contact pad 308 provides a route to the programmable trim circuit 207 that avoids the filter. However subsequently in a host device there will be no significant coupling of RF to the programming contact pad 308.

In the embodiment of FIG. 3 the second filter 302 for filtering the signal output line is also formed on the PCB substrate 307. This arrangement for the PCB substrate 307 thus avoids the need for filtering on the die 107 itself, which can reduce the size and cost of the die 107. This arrangement means that the relevant PCB substrate 307 can be used for dies without any filters present. If desired however it would be possible to have a filter for the signal out path integrated into the die 107, in a similar fashion as second filter 202 described with respect to FIG. 2, in additional to or instead of the second filter 302 formed on the PCB substrate 307.

As discussed above the programming contact pad 308 is provided to provide a reliable and convenient way of making a suitable electrical connection to the circuitry during a programming step to allow programming of the programmable trim circuit 207. It will be appreciated that during programming a suitable ground connection will also be made to the circuitry. In some instance a ground contact could be made via the PCB contact 309b that will, in use, operate as a ground terminal of the PCB substrate 307. However in some instances it may not be possible or desirable to make a ground contact with the ground terminal PCB contact 309b. Thus in some embodiments there may be a ground contact pad 311 electrically coupled to, or forming part of, a ground path. The ground contact pad 311 may, like the programming contact pad, be arranged to be readily and reliably contactable by an external apparatus such as a probe of an ATE apparatus.

Figure 5:
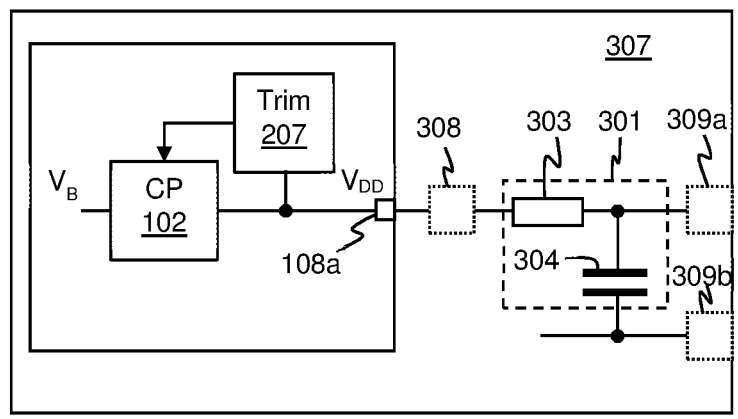
FIG. 5 illustrates another capacitive transducer apparatus according to an embodiment where a programming contact pad forms part of the voltage supply signal path.

In the arrangement discussed above the programming contact pad 308 is coupled to a node 310 of the voltage supply path between the first filter resistance 303 and the die contact 108a for the supply voltage via a circuit branch path. In some embodiments the programming contact pad 308 could be provided as part of this supply path as illustrated in FIG. 5. FIG. 5 illustrates just some of the same components as FIG. 3 and shows that the programming contact pad 308 is formed as part of the supply path between the filter resistance 303 and the die contact 108a for the supply voltage. Thus a terminal of a through-via connecting the external contact pad 308 to the internal circuitry may form part of the supply path. Depending on the layout of the PCB substrate 307 this may avoid unwanted signal path branches.

In the embodiments discussed above the programming contact pad 308 is coupled to the supply path for the supply voltage $V_{DD}$. As noted above this means that the control signals for programming the trim circuit 207 may be provided via the die contact 108a for the supply voltage, reducing the pin count for die 107. In some instances however there could be a separate die contact coupled to the programming contact pad 308, although this would add to the pin count.

Embodiments thus relate to apparatus and circuitry for operating capacitive transducers, especially MEMS capacitive transducers such as MEMS microphones which include a programmable circuit block. The circuitry includes a voltage supply path for receiving a supply voltage externally from the circuit wherein the voltage supply path includes a filter circuit with a filer resistor. The circuit also comprises a programming contact pad which is designed to allow an external apparatus to make a temporary electrical connection during a programming step, for the purposes of programming the programmable circuit block. A signal path between the programming contact pad and the programmable circuit block has limited or no filtering applied so as to not interfere with the programming of the programmable circuit block. In some embodiments at least part of the signal path between the programming contact pad and the programmable circuit block comprises part of the voltage supply path downstream of the filter resistor.

Note that as used herein the term 'programmable' shall be used to refer to components that are produced with some sort of memory or array which can be set into a desired state to control some aspect of operation. The programmable circuit block, e.g. the programmable trim circuit may be reconfigurable multiple times or may be one-time programmable and in any case the term programmable shall refer to the component before and/or after being programmed.

Embodiments are particularly applicable to circuitry for MEMS capacitive transducers, and especially to MEMS microphones. However the principles may be applied to sensing signals from other transducers or other types of sensors. The embodiments described above may be used in a range of devices, including, but not limited to: analogue microphones, digital microphones, pressure sensor or ultrasonic transducers. The invention may also be used in a number of applications, including, but not limited to, consumer applications, medical applications, industrial applications and automotive applications. For example, typical consumer applications include portable audio players, wearable devices, laptops, mobile phones, PDAs and personal computers. Examples may also be used in voice activated or voice controlled devices. Typical medical applications include hearing aids. Typical industrial applications include active noise cancellation. Typical automotive applications include hands-free sets, acoustic crash sensors and active noise cancellation. Embodiments may be implemented in a host device, especially a portable and/or battery powered host device such as a mobile telephone, an audio player, a video player, a PDA, a mobile computing platform such as a laptop computer or tablet and/or a games device for example.

It should be understood—especially by those having ordinary skill in the art with the benefit of this disclosure—that that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element. Further embodiments likewise, with the benefit of this disclosure, will be apparent to those having ordinary skill in the art, and such embodiments should be deemed as being encompassed herein. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A capacitive sensing transducer apparatus comprising:
   a voltage bias generator for receiving a supply voltage and generating a bias voltage for biasing a capacitive sensing transducer;
   a voltage supply path between a supply voltage input terminal and the voltage bias generator;
   a programmable trim circuit for, in use, controlling the bias voltage generated by the voltage bias generator;
   a first filter configured to applying filtering to the voltage supply path; and
   a programming contact pad that is electrically coupled to the programmable trim circuit via a signal path that does not include the first filter, the programming contact pad being configured to form an external contact of the capacitive sensing transducer apparatus when packaged; wherein:
      the programming contact pad is electrically coupled to the voltage supply path at a node between the first filter and the voltage bias generator; and
      the programmable trim circuit is electrically coupled to the voltage supply path between the first filter and the voltage bias generator.

2. The capacitive sensing transducer apparatus as claimed in claim 1 wherein the first filter comprises a first filter resistor in series in the voltage supply path and the programming contact pad is electrically coupled to the voltage supply path at a node between the first filter resistor and the voltage bias generator.

3. The capacitive sensing transducer apparatus as claimed in claim 1 wherein the programmable trim circuit is not electrically coupled to the voltage supply input terminal other than via the first filter.

4. The capacitive sensing transducer apparatus as claimed in claim 1 wherein the voltage bias generator and the programmable trim circuit are formed as an integrated circuit on a semiconductor die.

5. The capacitive sensing transducer apparatus as claimed in claim 4 wherein the semiconductor die is coupled to an apparatus substrate, wherein the supply voltage input terminal is a contact of the apparatus substrate and wherein the voltage supply path comprises a supply die contact of the semiconductor die.

6. The capacitive sensing transducer apparatus as claimed in claim 5 wherein the apparatus substrate comprises a printed circuit board.

7. The capacitive sensing transducer apparatus as claimed in claim 5 wherein the first filter is formed on the apparatus substrate.

8. The capacitive sensing transducer apparatus as claimed in claim 5 wherein the programming contact pad is formed on the apparatus substrate on an opposite side of the apparatus substrate to the semiconductor die.

9. The capacitive sensing transducer apparatus as claimed in claim 1 further comprising a ground contact pad electrically coupled to a ground path for the programmable trim circuit.

10. The capacitive sensing transducer apparatus as claimed in claim 9, wherein the semiconductor die is coupled to an apparatus substrate, wherein the supply voltage input terminal is a contact of the apparatus substrate and wherein the voltage supply path comprises a supply die contact of the semiconductor die and wherein the ground contact pad is formed on the apparatus substrate.

11. The capacitive sensing transducer apparatus as claimed in claim 1 further comprising an amplifier arrangement for amplifying an input signal from the capacitive transducer and a signal output path between the amplifier arrangement and a signal out terminal, wherein the apparatus comprises a second filter for applying filtering to the signal out path.

12. The capacitive sensing transducer apparatus as claimed in claim 11, wherein the semiconductor die is coupled to an apparatus substrate, wherein the supply voltage input terminal is a contact of the apparatus substrate and wherein the voltage supply path comprises a supply die contact of the semiconductor die and wherein the second filter is formed on the apparatus substrate.

13. The capacitive sensing transducer apparatus as claimed in claim 1 further comprising the capacitive sensing transducer.

14. The capacitive sensing transducer apparatus as claimed in claim 13 wherein said capacitive sensing transducer is a MEMS capacitive transducer.

15. The capacitive sensing transducer apparatus as claimed in claim 1 wherein the capacitive sensing transducer apparatus is packaged within a shielded housing having a plurality of external package contacts electrically coupled to the capacitive sensing transducer apparatus within the shielded housing and wherein the programming contact pad is one of said external package contacts.

16. The capacitive sensing transducer apparatus as claimed in claim 15 wherein the capacitive sensing transducer apparatus is located in a host device the programming contact pad is not connected to any conductive path outside of the shielded housing.

17. An electronic device comprising the capacitive sensing transducer apparatus as claimed in claim 1 wherein the electronic device is at least one of: a communications device; a mobile or cellular telephone; a computing device; a laptop, notebook, or tablet computer; a gaming device; a personal media device; a portable device; a battery powered device; a wearable device.

18. A capacitive sensing transducer apparatus comprising:
   a package structure;
   an integrated circuit die within the package structure;
   wherein the integrated circuit die comprises:
      a voltage bias generator for receiving a supply voltage and generating a bias voltage for biasing a capacitive transducer; and
      a programmable trim circuit for, in use, controlling the bias voltage generated by the voltage bias generator; and
      wherein the voltage bias generator and programmable trim circuit are both electrically coupled to a first die contact on said integrated circuit die;
   a first filter formed within the package structure on a first substrate separate to said integrated circuit die, the first filter comprising a filter resistor in series in a voltage supply path between a voltage supply terminal of the first substrate and the first die contact; and
   a programming contact pad forming an external electrical contact of the packaged structure, the programming contact pad being electrically coupled to a node of the voltage supply path between the filter resistor and the first die contact such that there is a signal path between the programming contact pad and the programmable trim circuit and wherein the signal path does not include said first filter.

* * * * *